United States Patent [19]
Tung

[11] Patent Number: 6,133,117
[45] Date of Patent: Oct. 17, 2000

[54] METHOD OF FORMING TRENCH ISOLATION FOR HIGH VOLTAGE DEVICE

[75] Inventor: Ming-Tsung Tung, Hsin-Chu, Taiwan

[73] Assignee: United Microlelectronics Corp., Hsin-Chu, Taiwan

[21] Appl. No.: 09/369,907

[22] Filed: Aug. 6, 1999

[51] Int. Cl.[7] ................................................ H01L 21/76
[52] U.S. Cl. .................... 438/433; 438/435; 438/449; 438/450; 438/451
[58] Field of Search .................................... 438/433, 439, 438/248, 243, 449

[56] References Cited

U.S. PATENT DOCUMENTS

| | | | |
|---|---|---|---|
| 5,686,347 | 11/1997 | Yang | 437/70 |
| 5,849,625 | 12/1998 | Hsue et al. | 438/424 |
| 5,891,776 | 4/1999 | Han et al. | 438/274 |
| 5,904,541 | 5/1999 | Rho et al. | 438/433 |

*Primary Examiner*—Mary Wilczewski
*Assistant Examiner*—Calvin Lee
*Attorney, Agent, or Firm*—Harness, Dickey & Pierce, P.L.C.

[57] ABSTRACT

A trench isolation structure for high voltage device is provided including a high voltage well, a low voltage well, and trench oxide. The high voltage well is formed first to be the deep junction isolation of isolation region. Next, the trench oxide isolation is formed overlying the high voltage well. Then, the low voltage well with higher concentration is formed underlying the trench oxide by using high energy implant. The isolation structure is a trench oxide(dielectric isolation)-junction isolation structure.

14 Claims, 4 Drawing Sheets

METHOD OF FORMING TRENCH ISOLATION FOR HIGH VOLTAGE DEVICE

BACKGROUND OF THE INVENTION

1. Field of the Invention

The present invention generally relates to a method for forming a semiconductor device, and more particularly, to a method for forming an isolation structure for a high voltage device.

2. Description of the Prior Art

Isolation is provided in a semiconductor between transistors on a semiconductor chip to prevent unwanted electrical connections therebetween.

Local oxidation of silicon (LOCOS) has long been the conventional process for fabricating isolation, and it has the advantage of being both relatively inexpensive and capable of providing isolation over wide areas of a chip. LOCOS has several disadvantages, however, among them the formation of a bird's beak that increases the horizontal space of the isolation, reducing the density of devices on a chip.

Because of its more vertical sidewalls and more planar surface, trench isolation provides significant advantage over LOCOS in the quest for providing high density integrated circuits. Trench isolation schemes are therefore finding increasing use in semiconductor processing.

On the development of ultra-large-scale-integrated (ULSI), layout rule will shrink and the application of product is going to invent on multi-chip of integrated function. The prior high-voltage device is implemented by LOCOS process, as shown in FIG. 1, while in deep submicron field is trench oxide. However, integrated high voltage device requires another method to isolate therebetween.

SUMMARY OF THE INVENTION

In accordance with the present invention, a method is provided for forming isolation structure that substantially can isolate an integrated high voltage device.

In one embodiment, a substrate is provided. Then, a high voltage tank is formed on the face of the substrate, and a trench isolation region is sequentially formed over the high voltage tank. A low voltage tank is formed under the trench isolation region and included the high voltage tank.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Moreover, while the present invention is illustrated by a number of preferred embodiments directed to silicon semiconductor devices, it is not intended that these illustrations be a limitation on the scope or applicability of the present invention. Further, while the illustrative examples use insulated gate control structures, it should be recognized that the insulated gate portions may be replaced with light activated or current activated structure(s). Thus, it is not intended that the semiconductor devices of the present invention be limited to the structures illustrated. These devices are included to demonstrate the utility and application of the present invention to presently preferred embodiments.

Further, various parts of the semiconductor elements have not been drawn to scale. Certain dimensions have been exaggerated in relation to other dimensions in order to provide a clearer illustration and understanding of the present invention. For the purposes of illustration the preferred embodiment of the semiconductor devices of the present invention have been shown to include specific P and N type regions, but it should be clearly understood that the teachings herein are equally applicable to semiconductor devices in which the conductivities of the various regions have been reversed, for example, to provide the dual of the illustrated device. Enhancement and depletion mode structures may be similarly interchanged.

Further, although the embodiments illustrated herein are shown in two dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

Figure 1:
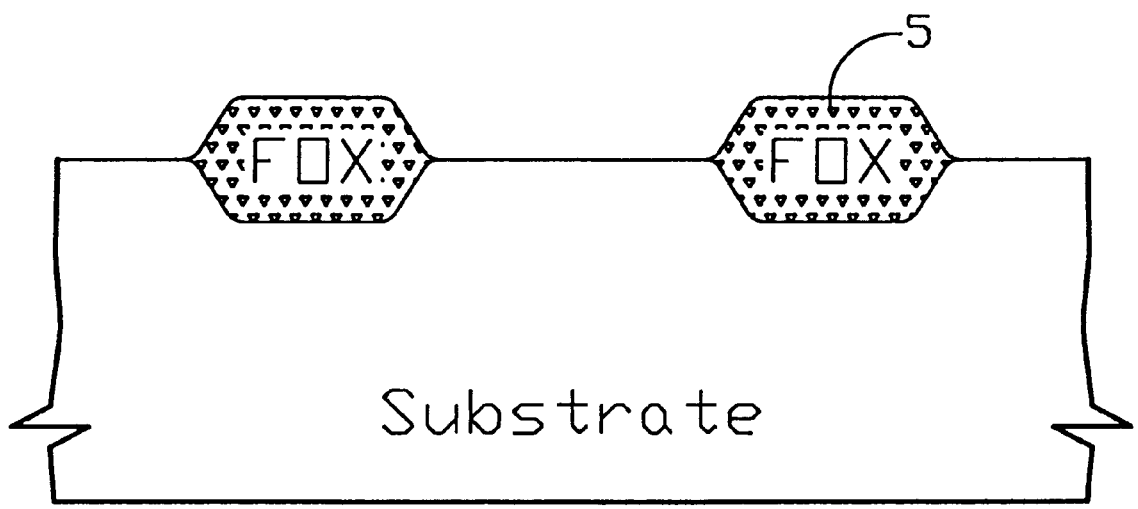
FIG. 1 is a cross-sectional view of a prior structure for isolation device.
Figure 2A:
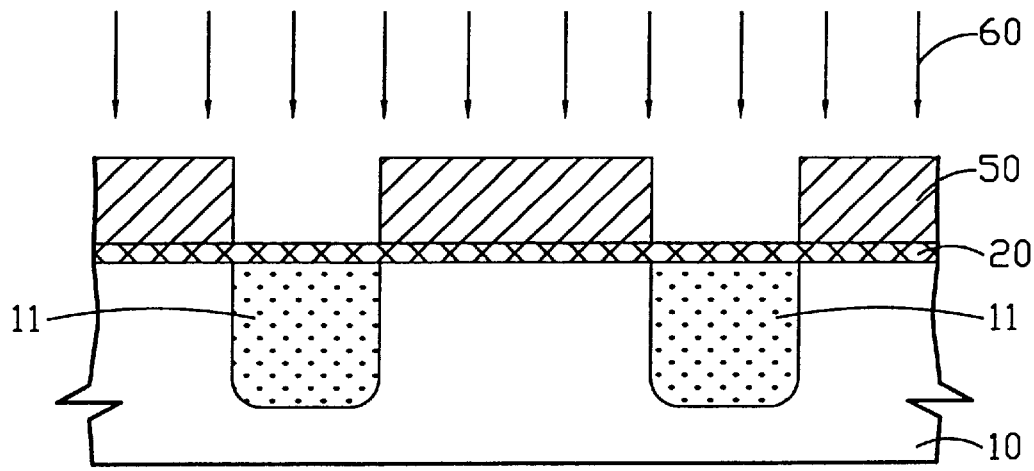
FIGS. 2A to 2H are schematic representations of structures at various stages during the formulation of isolation structure for high voltage device in accordance with a method disclosed.

Referring to FIG. 2A, a substrate 10 is provided and a silicon oxide layer 20 is formed thereon. In this embodiment, the conductivity of the provided substrate 10 is, not important. Rather it depends on the conductivity of the device. The oxide layer 20 with thickness between about 50 to 300 angstroms is formed by any conventional method such as heated in furnace. This oxide layer 20 is sacrificial oxide layer whose intent will prevent channel effect on the following ion implantation.

Then, a photoresist layer 50 is formed on this oxide layer 20 using any suitable method and transferred a high-voltage well pattern into this photoresist layer 50. In this embodiment, the region between the two wells is an active area. Then, an ion implantation 60 is introduced into substrate 10 to form a high-voltage well 11 and the photoresist layer 50 is then stripped. The term high-voltage denotes the voltages to which the devices formed in these wells will be subjected. High voltages, such as twelve and eighteen volts, or transients up to about sixty volts, usually require larger and deeper tanks but with smaller (or lighter) dopant concentrations. Having finished the ion implantation step, the wafer is placed into a furnace and the implanted ions will drive in substrate 10 by high temperature diffusion. Then, the oxide layer 20 is removed by any conventional method.

Figure 2B:
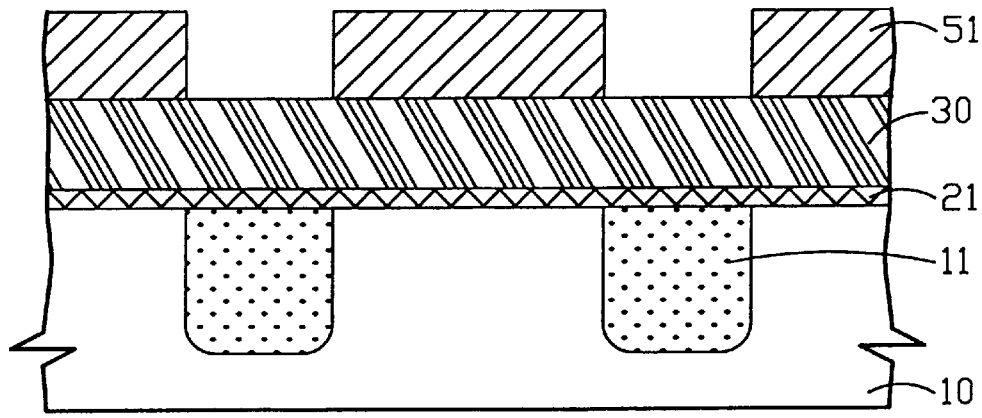

Referring to FIG. 2B, a pad oxide layer 21 is formed on the substrate 10 by using conventional thermal method and has a thickness between about 100 to 200 angstroms. The purpose of the pad oxide layer 21 is to act as a buffer between substrate 10 and the following silicon nitride layer since shear stress is produced between the silicon crystal and the silicon nitride layer and defects will be generated. Then, a silicon nitride layer 30 is deposited on the pad oxide layer 21 by using any conventional method, such as low pressure chemical vapor deposition (LPCVD) method or plasma enhanced chemical vapor deposition (PECVD) method, and has a thickness between about 1000 to 2000 angstroms. The prior application of silicon nitride layer is the mask of oxide layer in local oxidation (LOCOS) process. In this invention, the silicon nitride layer 30 is the mask of substrate 10 in forming trench isolation.

Figure 2C:
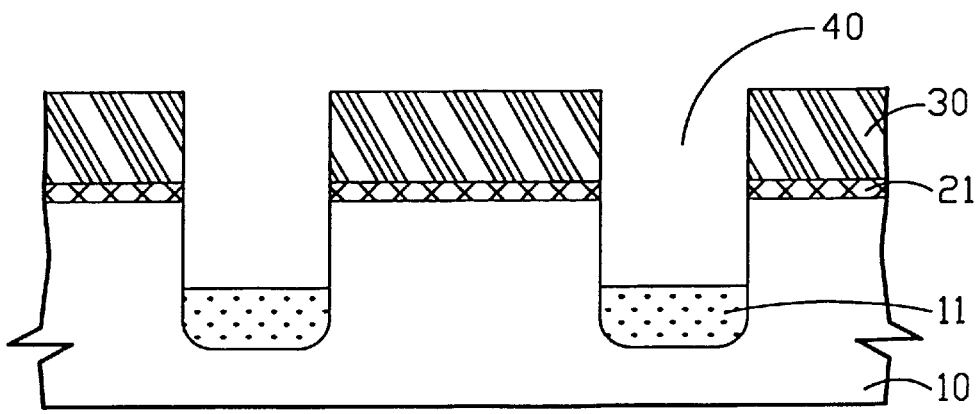

A photoresist layer 51 is formed on the silicon nitride layer 30 and transfers a trench isolation pattern into the photoresist layer 51. Referring to FIG. 2C, the silicon nitride layer 30, pad oxide layer 21 and substrate 10 are sequentially etched to form trench 40 using photoresist layer 52 as a mask by using suitable method. This etching step is essentially anisotropically dry etching, and the photoresist layer 51 is then stripped.

Figure 2D:
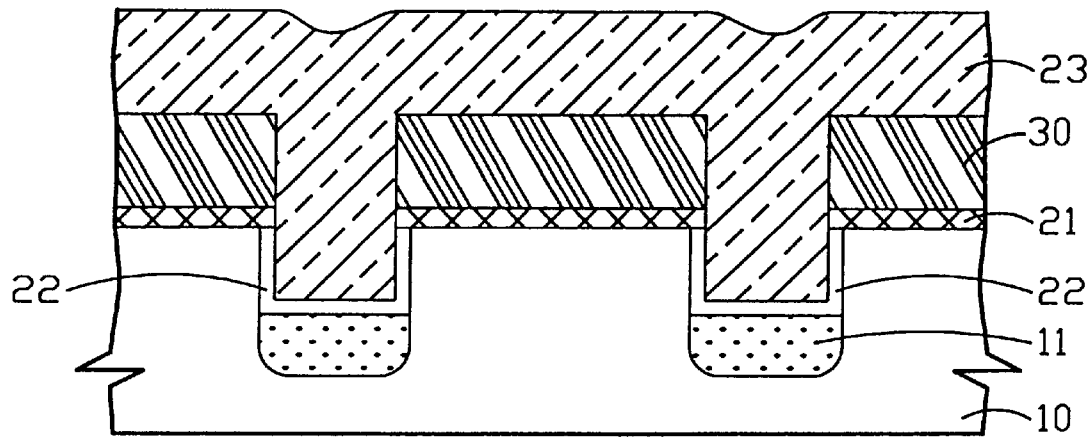

Then, the trench isolation openings are filled by silicon oxide. Referring to FIG. 2D, the wafer is placed into furnace to grow a silicon oxide layer 22 with thickness between about 100 to 500 angstroms. Then, another oxide layer 23 is deposited by using APCVD method and has a thickness between about 5000 to 9000 angstroms. Because the density of this APCVD oxide layer 23 is looser, the oxide layer 23 will be densified by placing wafer into furnace to high temperature.

Figure 2E:
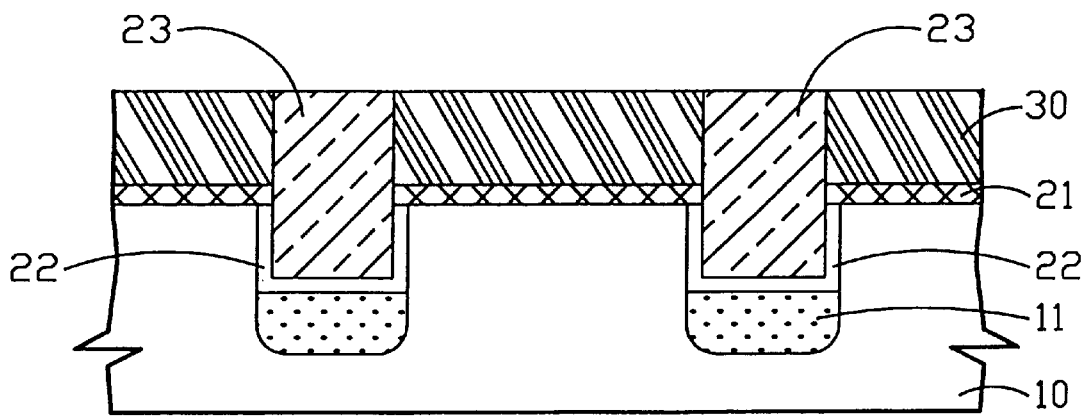
Figure 2F:
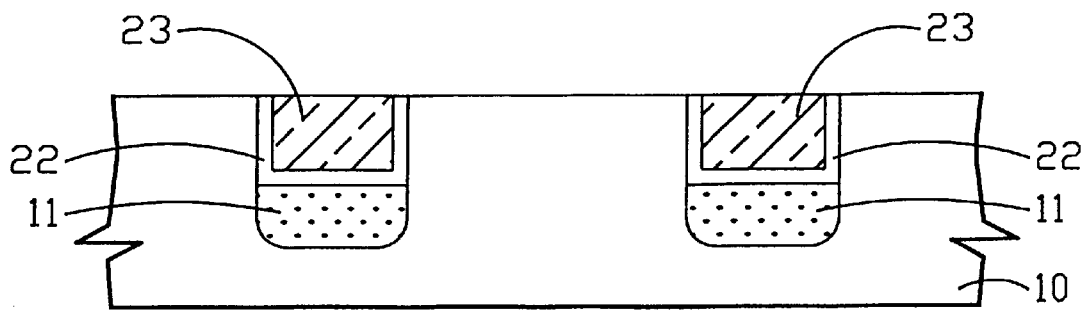

Referring to FIG. 2E, after depositing the oxide layer 23, the oxide layer 23 is planarized by using chemical mechanical polishing method. Then, the silicon nitride layer 30 and pad oxide layer 21 are removed by using any conventional method, as shown in FIG. 2F.

Figure 2G:
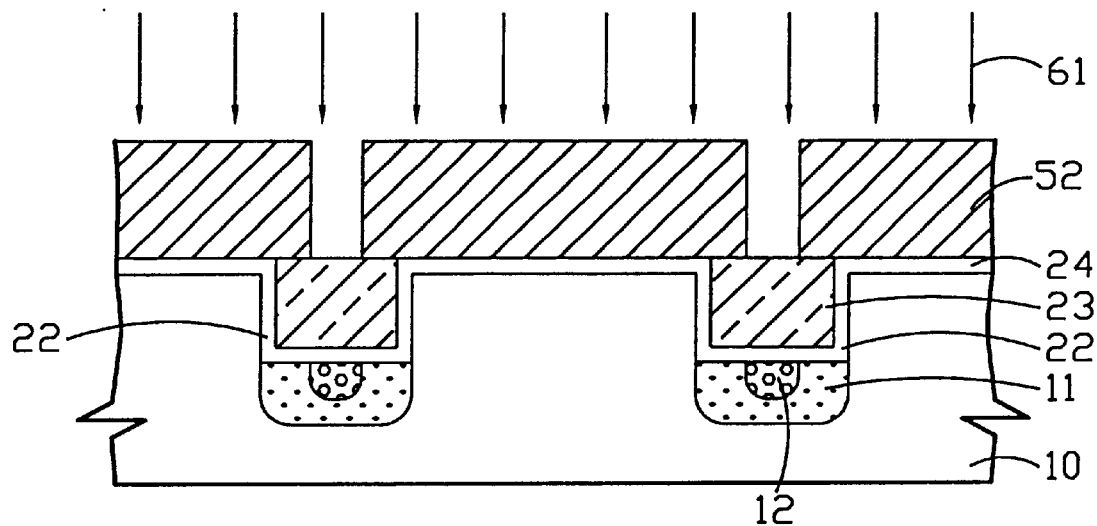
Figure 2H:
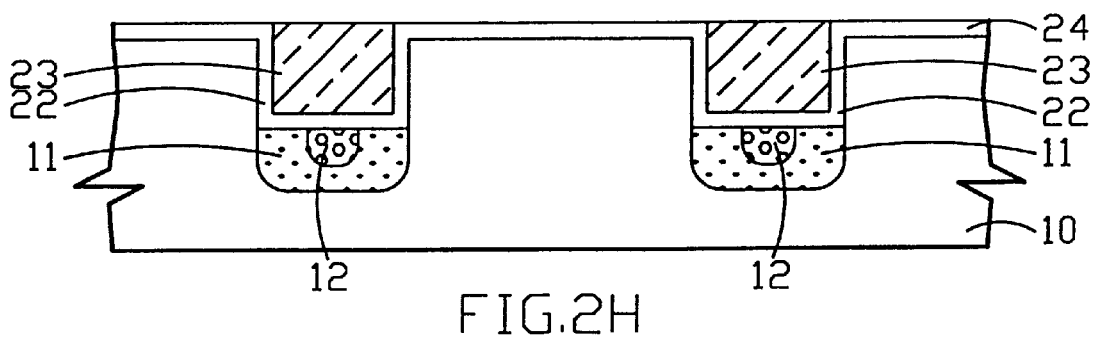

Before forming low-voltage well, another sacrificial oxide layer 24 is formed again on the substrate 10 and has a thickness between about 100 to 200 angstroms, as shown in FIG. 2G. Then, a photoresist layer 52 is formed on this oxide layer 24 by using any suitable method and transferred a low-voltage well pattern into this photoresist layer 52. Then, an ion implantation 61 having a concentration greater than the ion implantation 60 is introduced into substrate 10 to form a low-voltage well 12 and the photoresist layer 52 is then stripped. Having finished the ion implantation step, the wafer is placed into furnace and annealing by high temperature diffusion.

Although specific embodiments have been illustrated and described, it will be obvious to those skilled in the art that various modifications may be made without departing from what is intended to be limited solely by the appended claims.

What is claimed is:

1. A method of forming an isolation region in a semiconductor device, said method comprising:

providing a semiconductor substrate;

forming a first implant mask layer over said substrate, said first implant mask layer having a pattern defining the isolation region;

firstly implanting ions into said substrate by using said first implant mask layer as a mask, thereby forming a first implanted region in said substrate;

forming an etch mask layer over said substrate, said etch mask layer having a pattern substantially aligned to the isolation region;

etching an upper portion of the first implanted region by using said etch mask layer as a mask;

depositing a dielectric layer over the etched first implanted region to refill empty space of the etched upper portion of the first implanted region;

forming a second implant mask layer over said substrate, said second implant mask layer having a pattern aligned within the isolation region; and secondly implanting ions into said substrate by using said second implant mask layer as a mask, thereby forming a second implanted region located in the etched first implanted region.

2. The method according to claim 1, further comprising a step of forming an oxide layer on said substrate before forming said first implant mask layer.

3. The method according to claim 1, wherein said first implant mask layer comprises a photoresist layer.

4. The method according to claim 1, wherein said etch mask layer comprises a photoresist layer.

5. The method according to claim 4, further comprising a step of forming a pad oxide layer on said substrate before forming said etch mask layer.

6. The method according to claim 5, further comprising a step of forming a silicon nitride layer on said pad oxide layer before forming said etch mask layer.

7. The method according to claim 1, wherein said dielectric layer comprises silicon oxide.

8. The method according to claim 1, further comprising a step of conformably forming a silicon oxide layer on the surface of said etched first implanted region, and on the inner sidewall of exposed isolation region before depositing said dielectric layer.

9. The method according to claim 1, further comprising a step of planarizing said deposited dielectric layer until surface of said substrate is exposed.

10. The method according to claim 9, wherein said planarization is performed by a chemical-mechanical polishing technique.

11. The method according to claim 1, wherein said second implant mask layer comprises a photoresist layer.

12. The method according to claim 1, further comprising a step of forming a silicon oxide layer on said substrate before forming said second implant mask layer.

13. The method according to claim 1, wherein said first implanted region has a concentration less than said second implanted region.

14. A method of forming an isolation region in a semiconductor device, said method comprising:

providing a semiconductor substrate;

forming a first photoresist layer over said substrate, said first photoresist layer having a pattern defining the isolation region;

firstly implanting ions into said substrate by using said first photoresist layer as a mask, thereby forming a first implanted region in said substrate;

forming a pad oxide layer on said substrate;

forming a silicon nitride layer on said pad oxide layer;

forming a second photoresist layer over said substrate, said second photoresist layer having a pattern substantially aligned to the isolation region;

etching an upper portion of the first implanted region by using said second photoresist layer as a mask;

conformably growing a first silicon oxide layer on the surface of said etched first implanted region, and on the inner sidewall of exposed isolation region;

depositing a second silicon oxide layer over the etched first implanted region to refill empty space of the etched upper portion of the first implanted region;

planarizing said deposited second silicon oxide layer until surface of said substrate is exposed;

forming a third photoresist layer over said substrate, said third photoresist layer having a pattern aligned within the isolation region; and secondly implanting ions into said substrate by using said third photoresist layer as a mask, thereby forming a second implanted region located in the etched first implanted region, wherein said first implanted region has a concentration less than said second implanted region.

\* \* \* \* \*